(12) United States Patent
Harada (10) Patent No.: US 7,729,071 B2
(45) Date of Patent: Jun. 1, 2010

(54) READBACK APPARATUS AND READBACK METHOD

(75) Inventor: Kohsuke Harada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 453 days.

(21) Appl. No.: 11/896,211

(22) Filed: Aug. 30, 2007

(65) Prior Publication Data
US 2008/0151704 A1    Jun. 26, 2008

(30) Foreign Application Priority Data
Dec. 25, 2006    (JP) ............... 2006-348003

(51) Int. Cl.
*G11B 5/09*    (2006.01)
(52) U.S. Cl. .......................... 360/39; 360/65
(58) Field of Classification Search ............... None
See application file for complete search history.

(56) References Cited

U.S. PATENT DOCUMENTS

2007/0211362 A1* 9/2007 Li et al. .................. 360/39

FOREIGN PATENT DOCUMENTS

| JP | 2002-367291 | 12/2002 |
| JP | 2003-68024 | 3/2003 |
| JP | 2005-166089 | 6/2005 |

OTHER PUBLICATIONS

Notice of Reason for Rejection from the Japanese patent office for application No. 2006-348003, Mailed Jan. 6, 2009, with English language translation, thereof, total of 5 pages.
Abbott et al.; "Offtrack Interference and Equalization in Magnetic Recording", IEEE Transactions on Magnetics, vol. 24, No. 6, pp. 2964-2966, (1988).
Abbott et al.; "Performance of Digital Magnetic Recording With Equalization and Offtrack Interference", IEEE Transactions on Magnetics, vol. 27, No. 1, pp. 705-716, (1991).
Roh et al.; Single-Head/Single-Track Detection in Interfering Tracks, IEEE Transactions on Magnetics, vol. 38, No. 4, pp. 1830-1838, (2002).

* cited by examiner

*Primary Examiner*—Jason C Olson
(74) *Attorney, Agent, or Firm*—Finnegan, Henderson, Farabow, Garrett & Dunner, L.L.P.

(57) ABSTRACT

A readback apparatus (a) calculates a variance value of a signal read by a head from a disc medium, (b) estimates a degree of offtracking of the head from a target track to an adjacent track, and interference power from the adjacent track using the variance value of the signal, (c) calculates a soft decision likelihood value for the signal using the degree of offtracking and the interference power, and (d) performs error correcting decoding using the soft decision likelihood value.

14 Claims, 9 Drawing Sheets

READBACK APPARATUS AND READBACK METHOD

CROSS-REFERENCE TO RELATED APPLICATIONS

This application is based upon and claims the benefit of priority from prior Japanese Patent Application No. 2006-348003, filed Dec. 25, 2006, the entire contents of which are incorporated herein by reference.

BACKGROUND OF THE INVENTION

1. Field of the Invention

The invention relates to a readback apparatus which plays back a recording signal from a disc medium.

2. Description of the Related Art

For example, in a magnetic recording and readback apparatus, the signal-to-noise ratio (SNR) considerably deteriorates due to the contact of a recording and read head (to be simply referred to as a head hereinafter) to a disc medium, loss of magnetic substances on the disc medium, and poor alignment precision of the head, recorded data causes burst errors, and its readback becomes impossible.

Of these burst errors, a burst error caused when the head has contacted the disc medium has a feature in that large DC components are superposed on a readback signal when the head has contacted the disc medium, compared to normal readback. By exploiting this feature, a conventional magnetic recording and readback apparatus digitizes a signal read from the disc medium by the head, and detects the DC components of the digitized signal, thus detecting the position of occurrence of that burst error. As a result, a compensation using error correction processing can be applied to certain burst errors.

In the conventional magnetic recording and readback apparatus, an analog readback signal read from a disc medium (magnetic recording medium) by the head is input to an analog-to-digital converter and digitized. At this time, when the head contacts the disc medium and large DC components are superposed on the signal, if an analog signal output from the head in correspondence with a sample value after digitization exceeds a maximum input value to the analog-to-digital converter, the digital output after analog-to-digital conversion is saturated at a maximum output value of the analog-to-digital converter, and a readback waveform is lost.

A burst detector detects if the waveform of the digital readback signal output from the analog-to-digital converter is saturated at the predetermined maximum output value of the analog-to-digital converter. When the burst detector detects burst interference in which the readback signal after digitization is saturated at the maximum output value, a burst position detector detects the position of occurrence of an error due to the burst interference.

The readback waveform which is lost due to the burst interference is input to a finite impulse response (FIR) equalizer, which equalizes the waveform to an arbitrary partial response (PR) target (e.g., a PR target such as PR(1, 2, 2, 2, 1) or the like). Furthermore, when a Viterbi equalizer having a state transition of the PR target executes equalization processing again, readback data which is hard-decided to "0" and "1" and has suffered the burst error is obtained. The Viterbi equalizer executes Viterbi equalization using, as likelihood information, the distances between the readback signal equalized to the PR target and signal points defined by the PR target, thus obtaining readback data which is hard-decided to "0" and "1".

An error correcting decoder executes error correcting decoding processing using the hard-decided data which is obtained from the Viterbi equalizer and includes the burst error, and the burst position information detected from the readback signal by the burst position detector.

The error correcting decoder corrects the error included in the data after Viterbi equalization using error correcting codes such as Reed-Solomon (RS) codes or the like that requires hard-decided data upon decoding with respect to the hard-decided data obtained by Viterbi equalization, thereby obtaining user data.

With the aforementioned processing operations, even when a readback signal includes burst errors/losses caused when the head has contacted the disc medium, errors in readback data can be corrected. However, the aforementioned burst position detection method detects interference from an adjacent track, and appropriate processing cannot be applied.

In a magnetic recording and readback apparatus which plays back recorded data from a disc medium having neighboring data tracks, when a recording signal for an adjacent track is overwritten on that on a target track due to any offtracking of the head, or when the head position is displaced to an adjacent track upon readback to simultaneously readback signals on the target track and the adjacent track, the signal on the adjacent track becomes burst interference noise with respect to the signal obtained by reading back the target track, but no DC components are generated unlike in the aforementioned case. Therefore, since the signal after analog-to-digital conversion does not have any distinctive feature, and a burst error position cannot be detected, the error rate characteristics upon readback deteriorate considerably.

At this time, when error correcting codes using likelihood information are used upon error correcting decoding, the reliability of likelihood information of a part that has suffered burst interference from the adjacent track in the readback data becomes considerably low. For this reason, the potential correction capability of error correcting codes cannot be exploited, and the error rate of readback data after error correction deteriorates undesirably.

A reference (JP-A 2005-166089 (KOKAI)) discloses a technique for improving the decoding function for burst errors caused when the head has contacted the disc medium. However, the technique disclosed in this reference does not consider any burst error from an adjacent track. This reference cannot improve an error rate upon occurrence of interference from an adjacent track.

Since the conventional magnetic recording and readback apparatus cannot detect any interference noise from an adjacent track due to a offtracking of the head, it cannot accurately calculate likelihood information in a part that has suffered interference in the readback data. For this reason, when error correcting codes using likelihood information are used upon error correcting decoding, sufficient error correction capability cannot be exploited under the influence of likelihood information with low reliability of the interference part.

BRIEF SUMMARY OF THE INVENTION

According to embodiments of the present invention, a readback apparatus (a) calculates a variance value of a signal read by a head from a disc medium; (b) estimates a degree of offtracking of the head from a target track to an adjacent track, and interference power from the adjacent track using the variance value of the signal; (c) calculates a soft decision likelihood value for the signal using the degree of offtracking and the interference power; and (d) performs error correcting decoding using the soft decision likelihood value.

DETAILED DESCRIPTION OF THE INVENTION

Embodiments of the invention will be described hereinafter with reference to the accompanying drawings.

First Embodiment

This embodiment uses, as error correcting codes, turbo codes or low-density parity check (LDPC) codes that require soft decision likelihood information for "0" and "1" of readback data upon decoding. Also, using a max-log-MAP algorithm, soft-output Viterbi algorithm (SOVA), or the like which outputs the soft decision likelihood information and is equivalent to the Viterbi equalization in place of the conventional Viterbi equalization algorithm, error correcting decoding is executed for turbo codes or LDPC codes after Viterbi equalization.

In general, turbo codes or LDPC codes that use soft decision likelihood information have ordinary error rate characteristics superior to those of RS codes or the like, and are effective in a recording environment such as high-density recording or the like in which many data errors occur.

However, when the max-log-MAP algorithm or SOVA that can obtain soft decision likelihood information is used, noise power values at signal points equalized to the PR target must be used in the algorithm. For this reason, when noise power values which are different from actual values are used in the algorithm, the soft decision likelihood information to be obtained has low reliability, resulting in considerable characteristic deterioration.

The conventional readback apparatus can use ordinary noise power values at readback signal points after equalization to the PR target as known values by performing training in advance.

However, since it is impossible to train sudden interference noise like interference from an adjacent track, the noise power values of an interference part cannot be accurately set in the algorithm.

For this reason, in the conventional method, since the noise power of a part that has suffered interference from an adjacent track is largely different from trained noise power, when an algorithm such as the max-log-MAP algorithm that requires noise power values is used, soft decision likelihood information of the part that has suffered interference considerably loses reliability, thus deteriorating the error rate characteristics.

Furthermore, even when decoding processing is executed for turbo codes or LDPC codes using the soft decision likelihood information with low reliability, the potential correction capability cannot be exploited, and the error rate characteristics deteriorate.

Hence, a magnetic recording apparatus according to the embodiments to be described hereinafter sequentially estimates noise power due to interference from an adjacent track, which has occurred unexpectedly, and sequentially and appropriately applies the noise power values of the interference part to the max-log-MAP algorithm or the like, thus maintaining the reliability of the soft decision likelihood information of the interference part.

Figure 1:
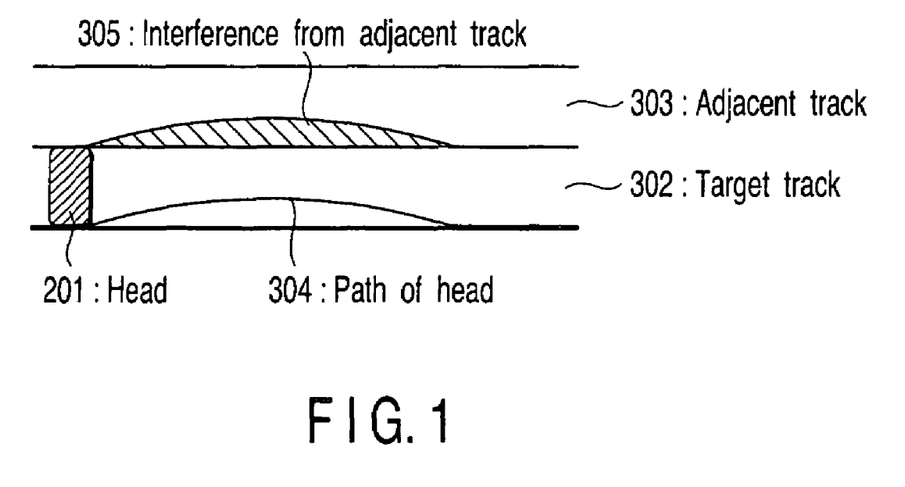
FIG. 1 is a view for explaining a mechanism of occurrence of interference between adjacent tracks.

In FIG. 1, when a head 201 causes a offtracking from the path of a target track 302 on a disc medium due to some external cause, and a readback signal from the disc medium is obtained, the readback signal is a sum of the signal obtained from the target track 302 and that obtained from an adjacent track 303.

Let W be the degree of offtracking of the head 201 to the adjacent track, i.e., a ratio of the offtracking of the head 201 to the adjacent track with respect to a track width which is normalized to "1" (the degree of offtracking at time t). Then, a readback signal s(t) at time t which has undergone analog-to-digital conversion and FIR equalization is expressed by:

$$s(t) = (1-W)s_{on}(t) + Ws_{ITI}(t) \quad (1)$$

where $s_{on}(t)$ is the readback signal obtained from the target track, and $s_{ITI}(t)$ is that obtained from the adjacent track. Also, s(t) is the readback signal after FIR equalization, which has suffered interference from the adjacent track.

When such readback signal is obtained, since the aforementioned head 201 does not contact a recording medium, the waveform of the obtained readback signal is not saturated after analog-to-digital conversion. For this reason, even when any loss of the waveform of the readback signal after analog-to-digital conversion due to saturation is detected, the arrangement of the conventional readback apparatus cannot detect interference from the adjacent track.

Upon execution of Viterbi equalization by calculating a likelihood value (metric value) using the readback signal after FIR equalization, a metric value λ used in Viterbi equalization is generally given by:

$$\lambda = \log \frac{-(r-s)^2}{\sigma^2} \quad (2)$$

where r is the sample point of the readback signal after FIR equalization (a signal point of the readback signal at time t), s is the reference signal point defined in the PR target used, and $\sigma^2$ is the variance of noise included in the readback signal. λ calculated using equation (2) is a likelihood of the sample point r of the readback signal with respect to each reference signal point s in the PR target.

Normally, the noise variance (noise power) at a sample point of the readback signal is measured in advance using a training sequence. When there is no interference from the adjacent track, the noise variance value $\sigma^2$, which is measured in advance, is used.

However, when interference from the adjacent track is included, an interference component $\sigma^2_{ITI}$ due to the readback signal from the adjacent track is added to the ordinary noise variance, so the noise variance value after FIR equalization must be $\sigma^2 + \sigma^2_{ITI}$. When the value $\sigma^2_{ITI}$ cannot be obtained, the metric of a part that has suffered interference from the adjacent track becomes inaccurate, and causes deterioration of the error rate characteristics.

A soft decision likelihood value $\Lambda$ of the sample point r of the readback signal, which is obtained by the max-log-MAP algorithm, SOVA, or the like, and is required to calculate a most likelihood bit ("0" or "1") of the sample point r of the readback signal, is given by:

$$\Lambda = \frac{\sum \alpha_1 \cdot \lambda(1) \cdot \beta_1}{\sum \alpha_0 \cdot \lambda(0) \cdot \beta_0} \quad (3)$$

where $\lambda(1)$ is the metric calculated using equation (2) with respect to a state transition path (defined by the PR target) which become "1" of a plurality of signal points (reference signal points) in the PR target. Also, $\lambda(0)$ is the metric calculated using equation (2) with respect to a state transition path which becomes "0" of the plurality of signal points in the PR target. $\alpha_j$ and $\beta_j$ are the state transition probability values which are calculated by the max-log-MAP algorithm and become "0" and "1", and are the forward and backward cumulative state transition probabilities the bit of interest is connected to a signal point "0" or "1" in the PR target.

As can be seen from equations (2) and (3), the soft decision likelihood value calculated using a wrong noise variance value has low reliability.

In this manner, when the readback signal has suffered interference from an adjacent track, the reliability of the soft decision likelihood value $\Lambda$ lowers unless an appropriate noise variance is set. Hence, this results in characteristic deterioration especially when turbo codes or LDPC codes that require soft decision likelihood information are used as error correcting codes.

In consideration of such problems, a case will be examined below wherein the noise variance value due to interference from the adjacent track is added to the likelihood calculations of equations (2) and (3).

Let $\delta_{on}^2$ be the variance of an ordinary readback signal $s_{on}(t)$ free from any interference from the adjacent track. This variance value has the same statistical nature even on the adjacent track.

At this time, when the head is displaced by W from the path of the target track with respect to the track width which is normalized to "1", and obtains a readback signal, the variance value of the obtained readback signal of the target track is given by:

$$(1-W)^2 \delta_{on}^2 \quad (4)$$

The variance of a readback signal obtained from the adjacent track at the same time is given by:

$$W^2 \delta_{on}^2 \quad (5)$$

The variance of a readback signal to be finally obtained as that obtained by adding these two signals is given by:

$$\delta_B^2 = (1-W)^2 \delta_{on}^2 + W^2 \delta_{on}^2 \quad (6)$$

The variance value $\delta_B^2$ of the readback signal must be sequentially and independently obtained from the readback signal after FIR equalization, which includes interference from the adjacent track.

According to the above relations, by calculating the degree W of offtracking of the head from the target track to its adjacent track with respect to the track width, the variance value of noise due to interference from the adjacent track, and an attenuation of the readback signal from the target track due to offtracking of the head from the target track can be calculated.

Rewriting equation (6) yields the degree W of offtracking of the head to the adjacent track, which is expressed by:

$$2W^2 - 2W + 1 - \frac{\delta_B^2}{\delta_{on}^2} = 0 \quad (7)$$

Hence, solving equation (7) for W using the quadratic formula yields two solutions:

$$W = \frac{1 \pm \sqrt{1 - 2\left(1 - \frac{\delta_B^2}{\delta_{on}^2}\right)}}{2} \quad (8)$$

One of the solutions indicates the ratio of offtracking of the head viewed from the target track, and the other of the solutions is the ratio of offtracking of the head viewed from the adjacent track.

The variance value $\delta_B^2$ of the readback signal after FIR equalization, which includes an interference component from the adjacent track is calculated in this manner, and the degree W of offtracking of the head is calculated from the obtained variance value $\delta_B^2$ and the variance value $\delta_{on}^2$ of the readback signal which is free from any interference from the adjacent track and is calculated in advance by training.

A noise variance value (noise power) $\sigma^2_{ITI}$ due to interference from the adjacent track can be calculated from the obtained degree W of offtracking of the head and the variance value $\delta_{on}^2$ using:

$$\sigma^2_{ITI} = W^2 \delta_{on}^2 \quad (9)$$

Furthermore, the amplitude attenuation of the readback signal of the target track due to offtracking of the head to the adjacent track is given by (1−W).

In consideration of the noise variance due to interference from the adjacent track, and the signal attenuation on the target track, the metric value $\lambda$ given by equation (2) can be rewritten as:

$$\lambda_G = \frac{-(r-(1-W)s)^2}{\sigma^2 + \sigma^2_{ITI}} = \frac{-(r-(1-W)s)^2}{\sigma^2 + W^2 \delta_{on}^2} \quad (10)$$

That is, substitutions of s in equation (2) by (1−W)s and of $\sigma^2$ by $\sigma^2 + \sigma^2_{ITI}$ yield the metric value $\lambda_G$ used in Viterbi equalization in consideration of interference from the adjacent track.

Figure 2:
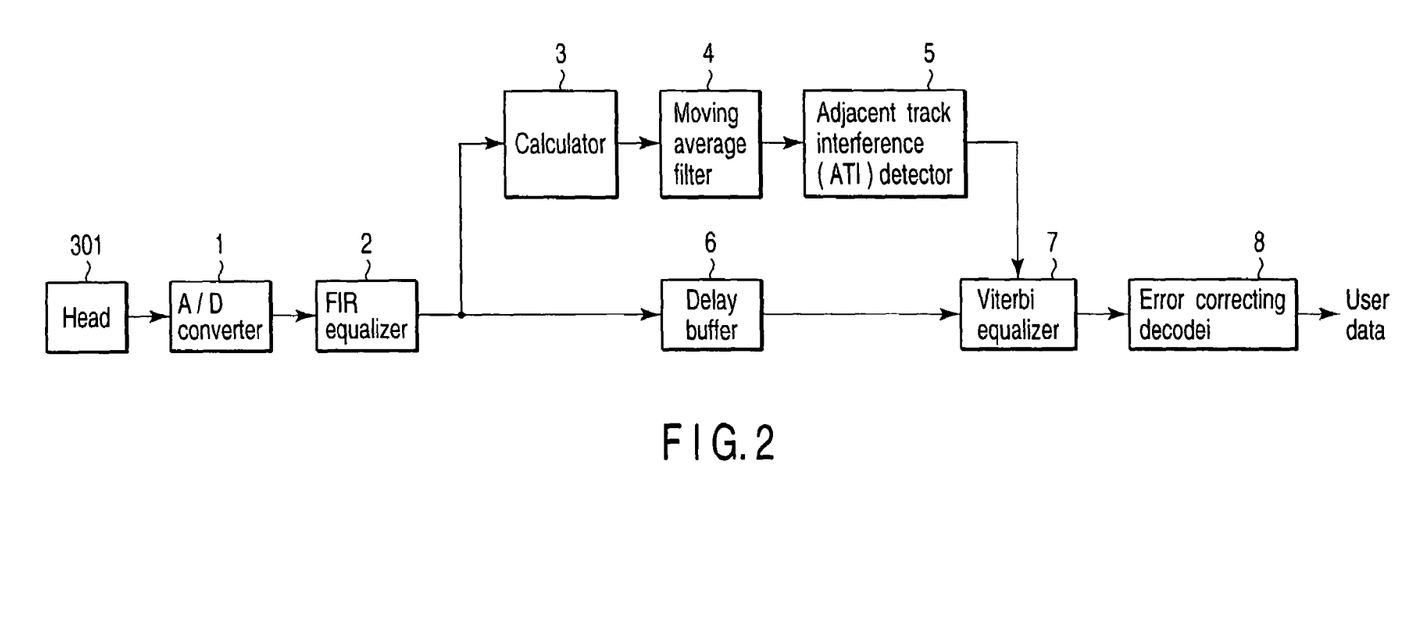
FIG. 2 is a block diagram showing an example of the arrangement of a readback apparatus according to the first embodiment.

Based on the aforementioned principle, a readback apparatus according to the first embodiment will be described below.

The readback apparatus in FIG. 2 sequentially calculates the variance of a readback signal required to detect interference from the adjacent track.

In the readback apparatus shown in FIG. 2, an analog-to-digital converter 1 digitizes an analog readback signal read from a disc medium (magnetic recording medium) by a recording and readback head (to be simply referred to as a head hereinafter) 301, and an FIR equalizer 2 then equalizes the resulting digital signal to be an arbitrary PR target signal.

Next, in the readback apparatus shown in FIG. 2, a calculator 3 calculates square values of sample values for the readback signal after FIR equalization. Then, a moving average filter 4 of M (M is a positive integer equal to or larger than 2) taps calculates an average value of the readback signal from the squared sample values for M taps to calculate the variance value of the readback signal, i.e., the variance value $\delta_B^2$ given by equation (6).

Note that the variance of the readback signal is calculated by calculating the moving average of squared sample values of the readback signal, since the moving average of the readback signal itself becomes "0".

An adjacent track interference detector 5 calculates, using equation (8), the degree W of offtracking of the head 301 from the obtained variance value $\delta_B^2$ and the variance value $\delta_{on}^2$ of the readback signal which is obtained in advance by training and is free from interference from the adjacent track. Furthermore, the adjacent track interference detector 5 calculates the noise variance value $W^2 \delta_{on}^2 = \delta_{ITI}^2$ due to interference from the adjacent track using the obtained degree W of offtracking of the head and the variance value $\delta_{on}^2$ of the readback signal, which is given beforehand. The obtained W and $\delta_{ITI}^2$ are output to a Viterbi equalizer 7.

Note that the adjacent track interference detector 5 stores the variance value $\delta_{on}^2$ of the readback signal, which is calculated in advance by training and is free from interference from the adjacent track.

The output from the FIR equalizer 2 is input to the calculator 3, and is also input to a delay buffer 6. The delay buffer 6 delays the readback signal after FIR equalization by a time period required until the adjacent track interference detector 5 calculates the degree W of offtracking of the head and the noise variance value $\delta_{ITI}^2$ due to interference from the adjacent track, and then inputs the delayed readback signal to the Viterbi equalizer 7.

The Viterbi equalizer 7 applies Viterbi decoding or the max-log-MAP algorithm or SOVA to the input readback signal. The Viterbi equalizer 7 calculates metrics $\lambda_G$ between the readback signal r after FIR equalization and signal points s in the PR target from equation (10) using the degree W of offtracking of the head 301 and the variance value $\delta_{on}^2$ of the readback signal, which is given in advance. Furthermore, the Viterbi equalizer 7 calculates the soft decision likelihood value $\Lambda$ from equation (3) using the metrics $\lambda_G$ calculated for the signal points s in the PR target.

Note that the Viterbi equalizer 7 applies equation (3) by substituting $\lambda(1)$ by $\lambda_G(1)$ and $\lambda(0)$ by $\lambda_G(0)$. In this case, $\lambda_G(1)$ is a metric calculated for the state transition path that becomes "1" of the plurality of signal points in the PR target using equation (10), and $\lambda_G(0)$ is a metric calculated for the state transition path that becomes "0" of the plurality of signal points in the PR target using equation (10). That is, the Viterbi equalizer 7 calculates the soft decision likelihood value $\Lambda$ using:

$$\Lambda = \frac{\sum \alpha_1 \cdot \lambda_G(1) \cdot \beta_1}{\sum \alpha_0 \cdot \lambda_G(0) \cdot \beta_0} \quad (11)$$

The Viterbi equalizer 7 outputs the obtained soft decision likelihood value $\Lambda$ to an error correcting decoder 8. In this manner, a soft decision likelihood value $\Lambda$ which considers the interference noise from the adjacent track with respect to respective bits ("0" and "1") of the readback data and has high reliability is obtained from the Viterbi equalizer 7.

The error correcting decoder 8 applies a decoding method for turbo codes, LDPC codes, and the like, and performs error correcting decoding (including hard decision) using the soft decision likelihood value $\Lambda$ obtained from the Viterbi equalizer 7, thus obtaining readback data (user data).

As described above, according to the first embodiment, the degree W of offtracking of the head to an adjacent track and the interference power $\sigma_{ITI}^2$ from the adjacent track are estimated from the variance $\delta_B^2$ of a signal (a signal after equalization) read from the disc medium, and a soft decision likelihood $\Lambda$ given by equation (11) that considers the degree of offtracking and the interference power from the adjacent track is calculated, thus improving the reliability of the soft decision likelihood information of a part in the readback data that has suffered interference from the adjacent track. Then, error correcting decoding is executed using this soft decision likelihood $\Lambda$ to obtain readback data (user data), thereby improving the error rate characteristics upon occurrence of interference from the adjacent track.

Second Embodiment

In general, in a magnetic recording system using a continuous magnetic recording medium, a readback signal includes noise components of jitter noise generated due to the magnetization inversion characteristics of the magnetic recording medium and a magnetic recording pattern recorded previously, and thermal noise generated by other electric circuits. An ordinary readback signal includes the jitter noise and thermal noise.

As a feature of these noise components, the jitter noise components are generated depending on data sequence pattern to be written: they have strong correlation between readback signals before and after the written data sequence, and the same frequency characteristics as the readback signal.

On the other hand, the thermal noise has non-correlated noise components between the written sequence and signals before and after that sequence, and has uniform frequency characteristics over a full frequency range with no correlation to the readback signal.

At this time, when the amplitude of a readback signal obtained from the target track drops by (1−W) due to the offtracking of the head to the adjacent track, since the thermal noise has no correlation to the readback signal, the noise variance remains unchanged. However, the jitter noise drops upon reduction of the target readback signal.

At this time, the jitter noise decreases by $(1-W)^2$ with respect to the signal attenuation (1−W) of the amplitude as in the attenuation of the power of the target track.

Let $\sigma_{jitter}^2$ be the variance of jitter noise free from burst interference. Then, the reduction of the jitter noise is expressed by $(1-W)^2 \sigma_{jitter}^2$.

However, noise power $\sigma^2$ that can be calculated by training is power including both the jitter and thermal noise components.

When the ratio of jitter noise and thermal noise ("jitter noise" vs. "thermal noise") of this noise power is defined by "$\epsilon:1-\epsilon$", the jitter noise $\sigma^2_{jitter}$ of the total noise power $\sigma^2$ measured in advance is given by $\epsilon\sigma^2$, and the thermal noise of the total noise power $\sigma^2$ is given by $(1-\epsilon)\sigma^2$. Note that $\epsilon$ is a value which is measured in advance and is given to the readback apparatus.

Assuming that the power attenuation of a target signal due to burst interference is given by $(1-W)^2$, from the above discussion, total noise power $\sigma^2+\sigma^2_{ITI}$ of the burst interference part is given using the jitter noise and thermal noise, and the noise variance value $\sigma^2_{ITI}$ due to interference from the adjacent track, which is given by equation (9), by:

$$(1-\epsilon)\sigma^2+(1-W)^2\epsilon\sigma^2+W\delta_{on}^2 \tag{12}$$

In this way, from equations (10) and (12), the metric value $\lambda_G$ used in Viterbi equalization upon occurrence of burst interference in consideration of noise distribution in the readback signal is given by:

$$\lambda_G = \frac{-(r-(1-W)s)^2}{(1-\varepsilon)\sigma^2+(1-W)^2\varepsilon\sigma^2+W^2\delta_{on}^2} \tag{13}$$

The metric value $\lambda_G$ calculated using equation (13) is a highly reliable metric value that considers the jitter noise and thermal noise, and the noise variance of the burst interference. Especially, since the reliability of the soft decision likelihood value of the burst interference part depends on the burst interference when using the max-log-MAP algorithm, that soft decision likelihood value is suited to use of the required turbo codes and LDPC codes, and allows to fully exploit the correction capability of error correcting codes.

As an equalization algorithm that considers the noise characteristics for the jitter noise with respect to the aforementioned Viterbi equalization, an auto-regressive (AR) model is known.

The AR model suppresses jitter noise on the time axis by exploiting the temporal correlation characteristics depending on the written data pattern of the jitter noise in a metric value, thus improving the error rate characteristics.

As in Viterbi equalization, a metric value used in the normal AR model is given by:

$$\lambda_{AR} = \tag{14}$$
$$\log(\sigma^2) + \frac{((r_t-s_t)-\mu_{t-1}(r_{t-1}-s_{t-1})-\ldots-\mu_{t-N}(r_{t-N}-s_{t-N}))^2}{\sigma^2}$$

where $\mu_{t-1}, \ldots, \mu_{t-N}$ are noise correlation coefficients from the current time t until one to N samples before. These noise correlation coefficients are calculated using noise correlation values in the time direction in a situation free from burst interference as in training required to calculate the noise variance. Also, this noise correlation strongly depends on the PR target used and a bit sequence to be written in the disc medium.

Derivation of a metric in the AR model upon occurrence of burst interference as in the above description will be examined below.

Noise of a part that has suffered burst interference can be handled as non-correlated noise on the target track, and noise correlation used in the AR model cannot be directly used since it is largely different in the burst interference from that upon training.

At this time, when noise components completely become only burst interference components, the correlation coefficients between noise components in the time direction become close to "0".

When the head is displaced by W with respect to the normalized track width, the total power of noise is given, as in Viterbi equalization, by:

$$(1-\epsilon)\sigma^2+(1-W)^2\epsilon\sigma^2+W^2\delta_{on}^2 \tag{15}$$

Noise components having correlation in the time direction hold correlation for terms other than the burst interference components of the total noise power.

At this time, the noise correlation coefficient used in the AR model decreases by (noise having correlation/total noise power) based on the power ratio between the burst interference and ordinary noise.

Since the noise correlation coefficient is calculated for the noise amplitude value, a reduction $\rho_{t-n}$ of a noise correlation function at time t-n can be calculated based on the power ratio between the total noise power given by equation (15) and noise components other than the burst interference components of the total noise power given by equation (15), using:

$$\rho_{t-n} = \sqrt{\frac{(1-\varepsilon)\sigma^2+(1-W_{t-n})^2\varepsilon\sigma^2}{(1-\varepsilon)\sigma^2+(1-W_{t-n})^2\varepsilon\sigma^2+W_{t-n}^2\delta_{on}^2}} \tag{16}$$

where $W_{t-n}$ is the degree of interference from the adjacent track (the degree of offtracking of the head). Note that n is a positive integer which falls within a range from 1 to N (both inclusive). Also, as in the above description, $\sigma^2$ is the noise variance value (noise power) which is measured in advance and is included in the readback signal, and $\epsilon$ and $\epsilon-1$ are the ratios of jitter noise and thermal noise, which are measured in advance, of the noise power $\sigma^2$.

Based on the above, from equation (15), since the total noise power at time t of the AR mode is expressed by equation (17), the metric value at time t of the AR model upon occurrence of the burst interference can be rewritten as equation (18).

$$(1-\varepsilon)\sigma^2+(1-W_t)^2\varepsilon\sigma^2+W_t^2\delta_{on}^2 \tag{17}$$

$$\lambda_{AR} = \log((1-\varepsilon)\sigma^2+(1-W_t)^2\varepsilon\sigma^2+W_t^2\delta_{on}^2)+ \tag{18}$$
$$\frac{\left((r_t-(1-W_t)s_t)-\rho_{t-1}\mu_{t-1}(r_{t-1}-(1-W_{t-1})s_{t-1})-\ldots-\rho_{t-N}\mu_{t-N}(r_{t-N}-(1-W_{t-N})s_{t-N})\right)^2}{(1-\varepsilon)\sigma^2+(1-W_t)^2\varepsilon\sigma^2+W_t^2\delta_{on}^2}$$

Using this metric value, upon executing equalization using the AR model in place of Viterbi equalization, an equalization that also considers noise depending on a write pattern can be made, and the reliability of the soft decision likelihood value of the burst interference part can be improved.

Note that even when the AR model is used the max-log-MAP algorithm or SOVA is used as the method of obtaining the soft decision likelihood value as in the Viterbi equalization.

As for the contents described so far, interference from an adjacent track due to the offtracking of the head to the adjacent track has been mainly described. Note that the same discussion as given so far applies when the recorded data on the target track are partially overwritten due to a offtracking of the recording head to an adjacent track.

Figure 3:
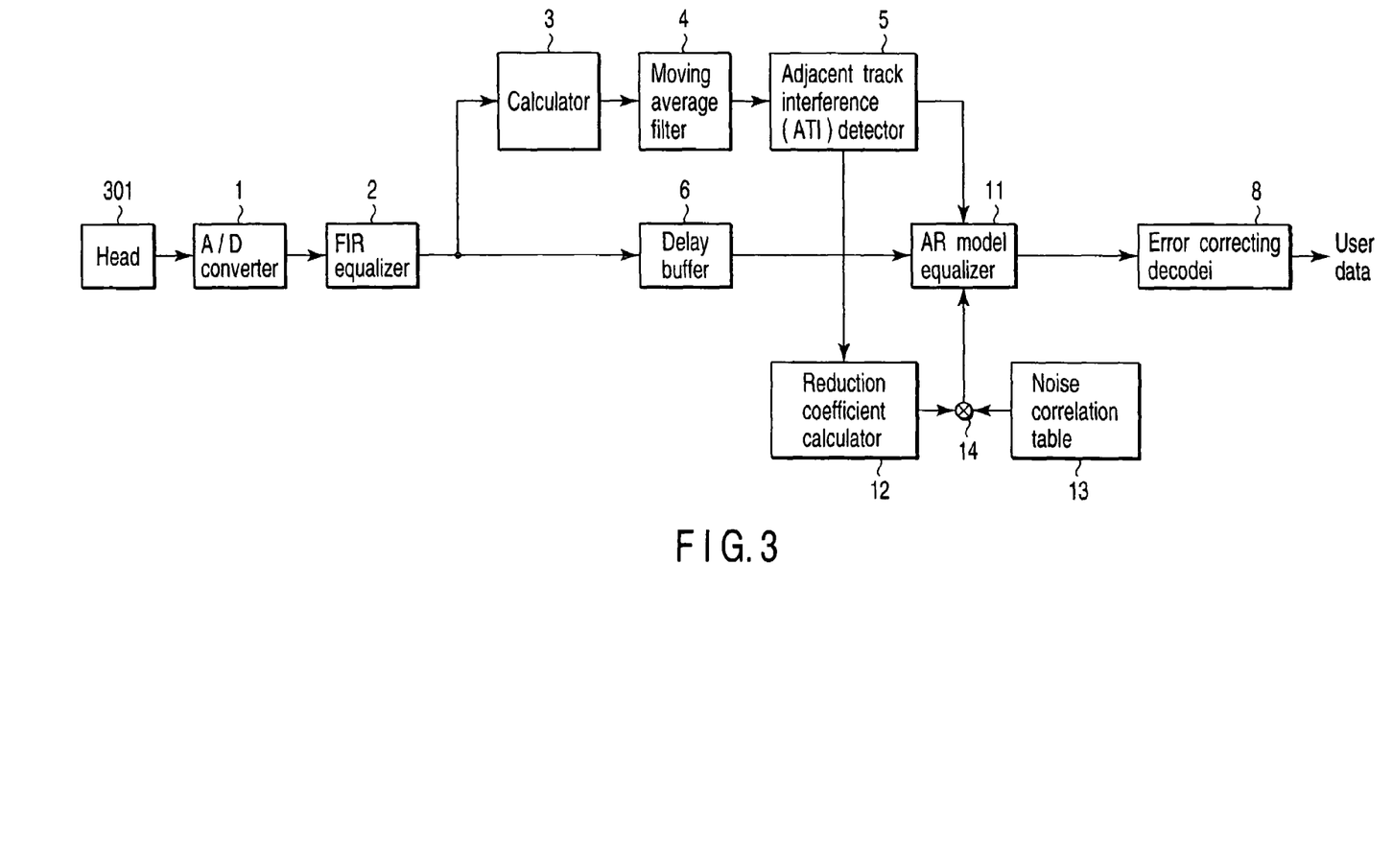
FIG. 3 is a block diagram showing an example of the arrangement of a readback apparatus according to the second embodiment.

The aforementioned AR model is applied to the readback apparatus in FIG. 3. Note that the same reference numerals in FIG. 3 denote the same parts as in FIG. 2, and only differences will be described below.

In the readback apparatus in FIG. 3, the calculator 3 calculates the square values of the sample values based on the readback signal after FIR equalization, and the moving average filter 4 of M taps calculates the variance value $\delta_B^2$ of the partial readback signal, as in FIG. 2. The adjacent track interference detector 5 calculates the degree of interference (a degree of offtracking of the head) $W_t$ at time t from the obtained variance value $\delta_B^2$ of the readback signal using equation (8). Furthermore, the adjacent track interference detector 5 calculates a noise variance value $W_t \delta_{on}^2$ due to interference from the adjacent track at time t using equation (9), the obtained degree $W_t$ of offtracking of the head, and the variance value $\delta_{on}^2$ of the readback signal, which is given in advance.

In the readback apparatus of FIG. 3, the obtained degree $W_t$ of interference and noise variance value $W_t \delta_{on}^2$ due to interference from the adjacent track at time t are output to an AR model equalizer 11 and reduction coefficient calculator 12.

A noise correlation table 13 stores noise correlation coefficients $\mu_{t-1}, \ldots, \mu_{t-N}$ from the current time t until one to N samples before, which are measured in advance.

The reduction coefficient calculator 12 respectively calculates N reduction coefficients $\rho_{t-n}$ (n meets $1 \leq n \leq N$) of noise correlation values due to the burst interference at sample points before the current time of the readback signal (for the AR model equalizer 11) using the degrees $W_{t-1}, \ldots, W_{t-N}$ of interference obtained from the adjacent track interference detector 5, which are obtained before the current time, the noise variance values $W_{t-1} \delta_{on}^2, \ldots, W_{t-N} \delta_{on}^2$ due to interference from the adjacent track, the noise variance value $\sigma^2$ which is given in advance, and the ratio $\epsilon$ of the jitter noise of the noise variance value $\sigma^2$. A calculator 14 multiplies the obtained N reduction coefficients by the correlation coefficients $\mu_{t-n}$ (n meets $1 \leq n \leq N$) stored in the noise correlation table 13. Products $\rho_{t-1} \mu_{t-1}, \ldots, \rho_{t-n} \mu_{t-n}, \rho_{t-N} \mu_{t-N}$ of the reduction functions and correlation coefficients, which are obtained by the calculator 14, are input to the AR model equalizer 11, and are used as noise correlation values.

The AR model equalizer 11 calculates, using equation (18), metrics $\lambda_{AR}$ between the readback signal r after FIR equalization and the respective signal points s in the PR target at time t using the products $\rho_{t-1} \mu_{t-1}, \ldots, \rho_{t-n} \mu_{t-n}, \rho_{t-N} \mu_{t-N}$ of the reduction functions and correlation coefficients, which are calculated by the calculator 14, degrees $W_{t-1}, \ldots, W_{t-N}$ of interference at times t-N, ..., t-1, t, which are output from the adjacent track interference detector 5, and the noise variance value $W_t \delta_{on}^2$ due to interference from the adjacent track at time t. Note that the noise variance value $\sigma^2$ and the ratio E of jitter noise of the noise variance value $\sigma^2$ are values which are given (stored) in advance to the AR model equalizer 11.

Furthermore, the AR model equalizer 11 calculates the soft decision likelihood value $\Lambda$ using the metrics $\lambda_{AR}$ calculated for the respective signal points in the PR target and equation (3).

Note that the AR model equalizer 11 applies equation (3) by substituting $\lambda(1)$ by $\lambda_{AR}(1)$ and $\lambda(0)$ by $\lambda_{AR}(0)$. In this case, $\lambda_{AR}(1)$ is a metric calculated for the signal point that becomes "1" of the plurality of signal points in the PR target using equation (18), and $\lambda_{AR}(0)$ is a metric calculated for the signal point that becomes "0" of the plurality of signal points in the PR target using equation (18). That is, the AR model equalizer 11 calculates the soft decision likelihood value $\Lambda$ using:

$$\Lambda = \frac{\sum \alpha_1 \cdot \lambda_{AR}(1) \cdot \beta_1}{\sum \alpha_0 \cdot \lambda_{AR}(0) \cdot \beta_0} \tag{19}$$

The AR model equalizer 11 outputs the obtained readback data and soft decision likelihood value $\Lambda$ to the error correcting decoder 8.

The error correcting decoder 8 applies a decoding method for turbo codes, LDPC codes, and the like, and performs error correcting decoding (including hard decision) using the soft decision likelihood value $\Lambda$ obtained from the AR model equalizer 11, thus obtaining user data.

Figure 4:
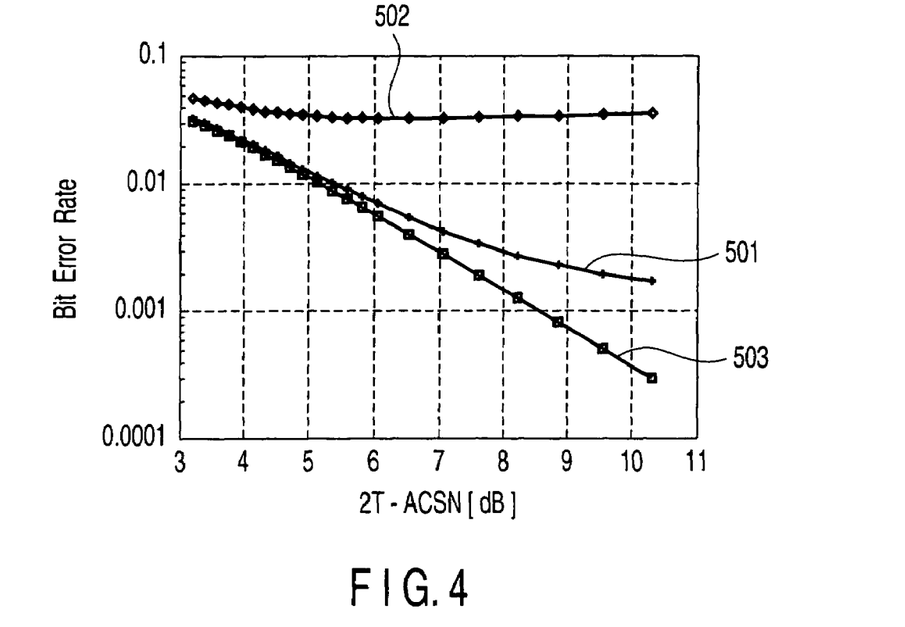
FIG. 4 is a graph showing the bit error rate (BER) characteristics of readback data before error correcting decoding upon executing equalization based on an AR model.

FIG. 4 shows the bit error rate (BER) characteristics 501 of readback data before error correcting decoding upon executing equalization based on the AR model, and FIG. 4 also shows BER characteristics 502 before error correcting decoding upon execution of the conventional Viterbi equalization, and ideal error rate characteristics 503, for the sake of comparison. FIG. 4 shows the BER characteristics measured under the conditions that the length of interference from the adjacent track is 1000 bits, the degree W of offtracking of the head to the adjacent track is "0.2", and the tap length of the moving average filter is "100".

BER characteristics 501 upon execution of equalization based on the AR model shown in FIG. 4 are those of a signal immediately after equalization using the max-log-MAP algorithm in equalization based on the AR model by the AR model equalizer 11 (before error correction which is output from the AR model equalizer 11).

As can be seen from FIG. 4, the BER characteristics 501 upon execution of the equalization based on the AR mode are improved compared to the BER characteristics 502 upon execution of the conventional Viterbi equalization regardless of interference from the adjacent track.

Figure 5:
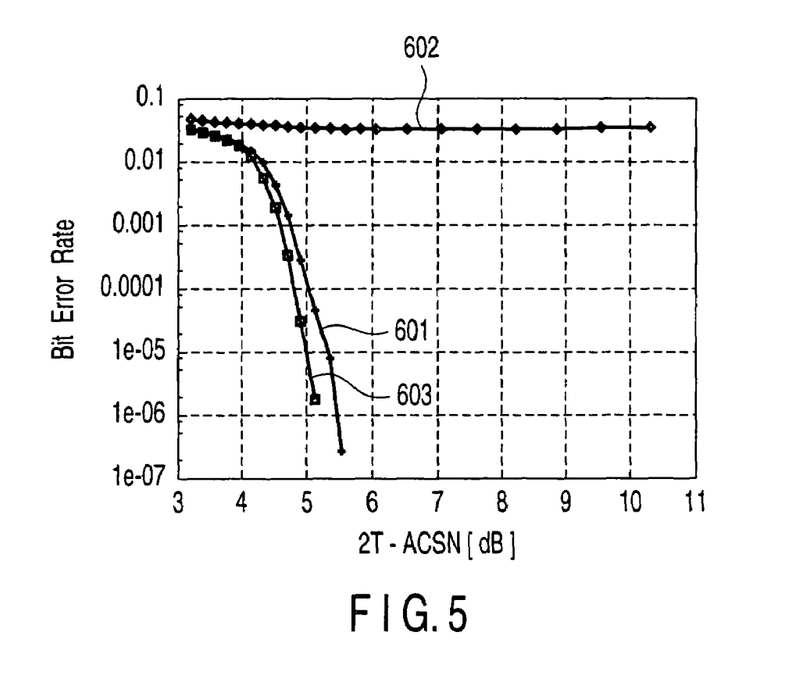
FIG. 5 is a graph showing the bit error rate (BER) characteristics of readback data after error correcting decoding upon executing equalization based on an AR model.

The BER characteristics 601, 602, 603 in FIG. 5 are the BER characteristics of readback data after error correcting decoding in the above three cases respectively, when the LDPC codes are used as error correcting codes in addition to the conditions used in FIG. 4. The BER characteristics 601 is the BER characteristics of readback data after error correcting decoding upon execution of the equalization based on the AR model. The BER characteristics 601 corresponds to the case upon execution of conventional Viterbi equalization, and the BER characteristics 603 corresponds to the ideal BER characteristics.

As indicated by BER characteristics 602 when error correcting decoding is executed after the conventional Viterbi equalization regardless of interference from the adjacent track, the reliability of likelihood information lowers due to the interference of the noise variance from the adjacent track, and errors cannot be corrected even using the LDPC codes that require the likelihood information.

However, as indicated by BER characteristics 601 when error correcting decoding is executed after the equalization based on the AR model according to the second embodiment, the reliability of the soft decision likelihood information $\Lambda$ of the interference part is improved, and the potential error correcting capability of the LDPC codes can be exploited.

As described above, according to the second embodiment, interference components between adjacent tracks are calculated to calculate the soft decision likelihood $\Lambda$ that considers the interference components. Then, the error correcting decoding using the LDPC codes or the like is executed using the soft decision likelihood Λ, thus greatly improving the error rate when readback data has suffered interference from the adjacent track.

Third Embodiment

A readback apparatus which has a function that when detecting large interference from the adjacent track a part in readback data where the interference is detected is handled as a lost part will be described below.

Note that the same reference numerals in FIG. 6 denote the same parts as in FIG. 3, and only differences will be described below. That is, in FIG. 6, a loss position detector 21 is added.

When the degree W of offtracking of the head to the adjacent track becomes equal to or larger than a certain value (e.g., W=0.3 or 0.5 although this value varies depending on readback apparatuses) with respect to the normalized track width, the signal power from the adjacent track becomes larger than that of a readback signal of the target track. In this case, the apparent signal-to-noise ratio (SNR) becomes 0 dB or less, on the readback signal after FIR equalization, and errors cannot be corrected in practice. That is, when an offtracking of the head that is equal to or larger than a predetermined threshold has occurred with respect to the track width, information of that part may be handled as lost information.

In this manner, when large interference from the adjacent track is handled, such interference can be copied with by an arrangement which detects a burst loss that has occurred when the head contacted a magnetic recording surface, and loss correction is made upon decoding error correcting codes like in the conventional readback apparatus.

Figure 6:
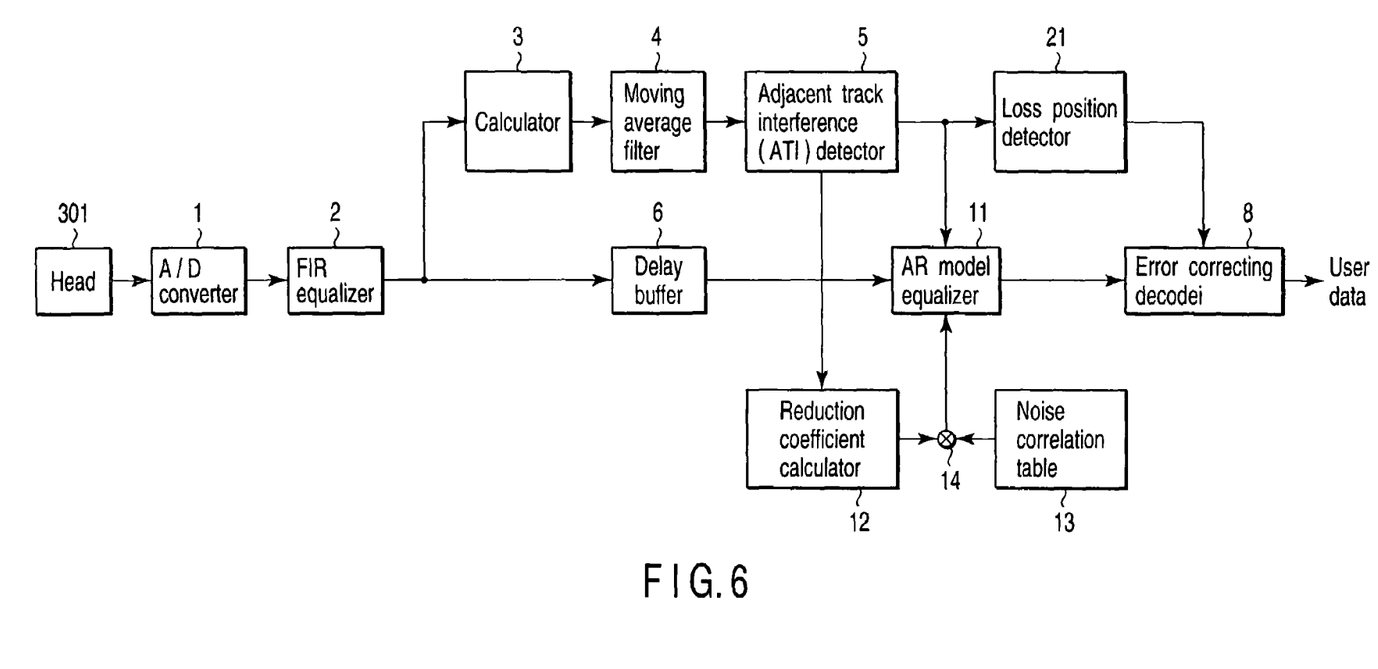
FIG. 6 is a block diagram showing an example of the arrangement of a readback apparatus according to the third embodiment.

The loss position detector 21 in FIG. 6 has a function of detecting information loss due to interference from the adjacent track.

In the readback apparatus shown in FIG. 6, as in FIG. 3, the analog-to-digital converter 1 digitizes an analog readback signal read by the head 301 from the disc medium, and the FIR equalizer 2 equalizes the resulting digital signal into a desired PR target. The calculator 3 then calculates the square values of the sample values based on the readback signal after FIR equalization, and the moving average filter 4 of M taps calculates the variance value of the readback signal. The adjacent track interference detector 5 calculates the degree of interference from the adjacent track at time t, i.e., a degree $W_t$ of offtracking of the head, and a noise variance value $W_t \delta_{on}^2$ due to interference from the adjacent track at time t from the obtained variance value $\delta_B^2$ of the readback signal and the like, and outputs them to the AR model equalizer 11 and reduction coefficient calculator 12. The adjacent track interference detector 5 in the readback apparatus of FIG. 6 also outputs the degree $W_t$ of offtracking of the head to the loss position detector 21.

When the value of the degree of offtracking of the head is equal to or larger than a predetermined threshold Wth, the loss position detector 21 determines that recorded information is lost, and generates loss position information indicating a position (loss position) where the recorded information is lost.

On the other hand, in the readback apparatus of FIG. 6, as in FIG. 3, the AR model equalizer 11 executes Viterbi equalization according to the AR model using the max-log-MAP algorithm or the like that uses the metric values in consideration of the noise variance due to interference from the adjacent track, and outputs a soft decision likelihood value Λ to the error correcting decoder 8.

The error correcting decoder 8 of FIG. 6 applies a decoding method for turbo codes, LDPC codes, and the like, and performs error correcting decoding (including hard decision) using the obtained soft decision likelihood value. At this time, the decoder 8 skips error correcting decoding at the loss position designated by the loss position information output from the loss position detector 21, and uses a decoding algorithm for loss correction at that position.

In this manner, when recorded information is lost as a result of occurrence of extremely large interference from the adjacent track, the decoding algorithm for loss correction is used for the part where the recorded information is lost in place of error correcting decoding, thus suppressing deterioration of the error rate characteristics.

Note that FIG. 6 shows the arrangement in which the loss position detector 21 is added to the readback apparatus shown in FIG. 3. However, the invention is not limited to such specific case. For example, the same effects can be obtained in case of the arrangement in which the loss position detector 21 is added to the readback apparatus shown in FIG. 2, as shown in FIG. 7.

Figure 7:
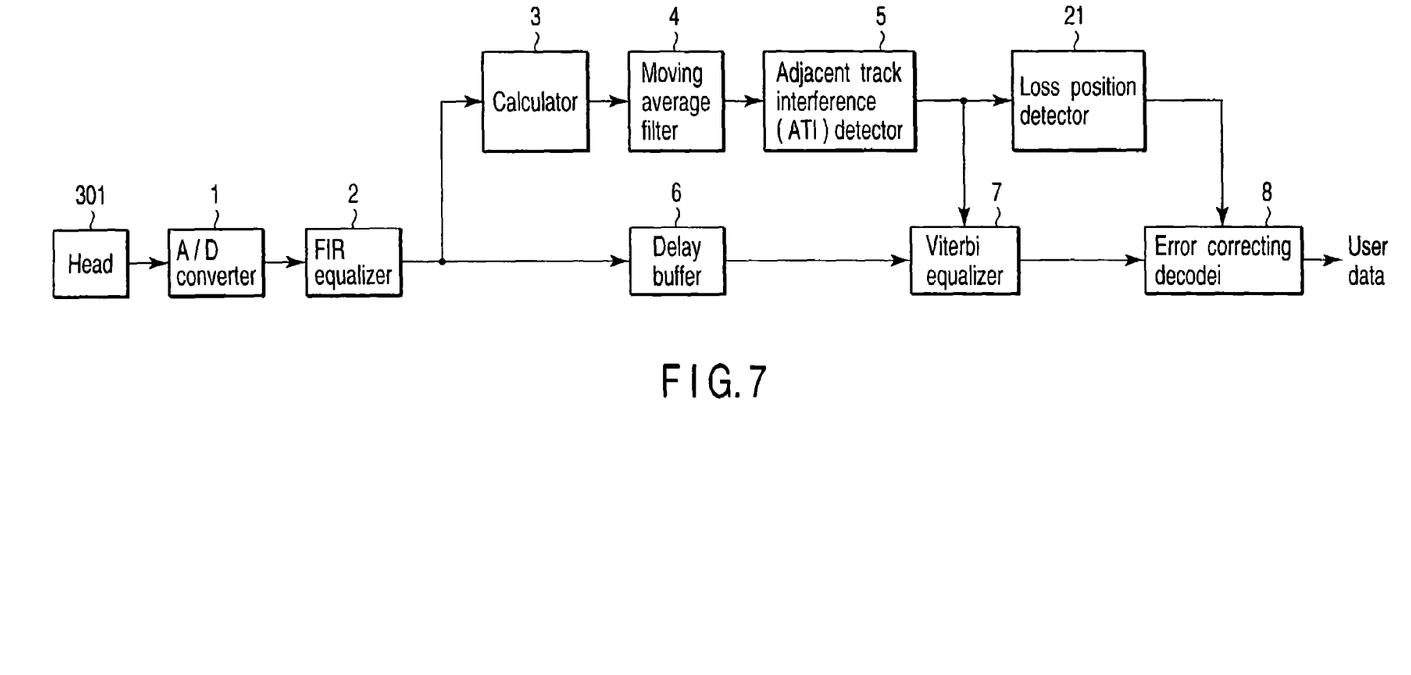
FIG. 7 is a block diagram showing another example of the arrangement of the readback apparatus according to the third embodiment.

More specifically, in the readback apparatus shown in FIG. 7, as in FIG. 2, the analog-to-digital converter 1 digitizes an analog readback signal read by the head 301 from the disc medium, and the FIR equalizer 2 equalizes the resulting digital signal into a desired PR target. The calculator 3 then calculates the square values of the sample values based on the readback signal after FIR equalization, and the moving average filter 4 of M taps calculates the variance value $\delta_B^2$ of the readback signal. The adjacent track interference detector 5 calculates the degree of interference from the adjacent track, i.e., a degree W of offtracking of the head, and a noise variance value $\delta^2_{ITI}$ due to interference from the adjacent track from the obtained variance value of the readback signal and the like. The detector 5 outputs the obtained degree of offtracking of the head and noise variance value to the Viterbi equalizer 7. The adjacent track interference detector 5 in the readback apparatus of FIG. 7 also outputs the degree W of offtracking of the head to the loss position detector 21. When the value of the degree W of offtracking of the head is equal to or larger than a predetermined threshold Wth, the loss position detector 21 generates loss position information indicating a position (loss position) where recorded information is lost, and outputs that information to the error correcting decoder 8.

In the readback apparatus of FIG. 7, as in FIG. 2, the Viterbi equalizer 7 executes Viterbi equalization using the max-log-MAP algorithm or the like that uses the metric values in consideration of the noise variance due to interference from the adjacent track, and outputs a soft decision likelihood value Λ to the error correcting decoder 8. The error correcting decoder 8 applies a decoding method for turbo codes, LDPC codes, and the like, and performs error correcting decoding (including hard decision) using the obtained soft decision likelihood value. At this time, the decoder 8 skips error correcting decoding at the loss position designated by the loss position information output from the loss position detector 21, and uses a decoding algorithm for loss correction at that position.

Fourth Embodiment

A readback apparatus which can also cope with a burst loss that occurs when the head has contacted a disc medium will be described below.

Figure 8:
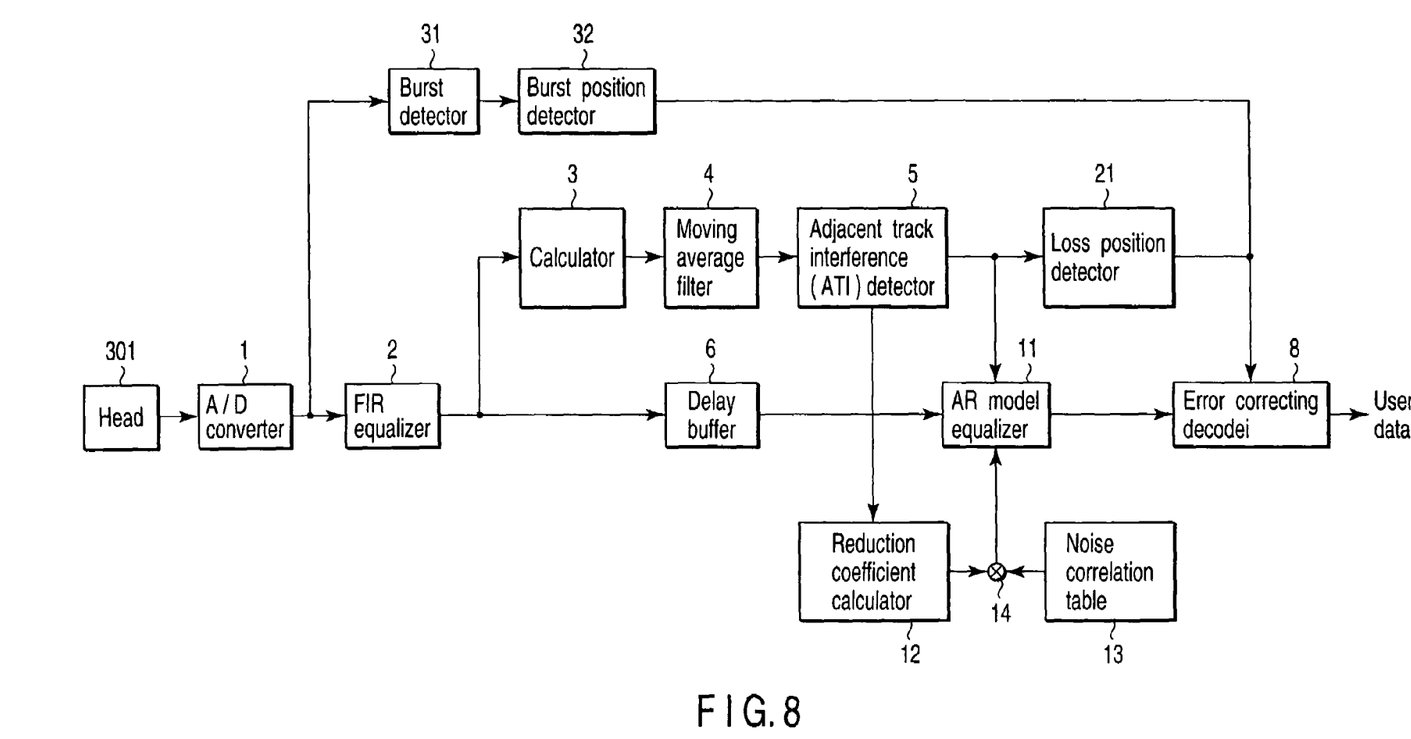
FIG. 8 is a block diagram showing an example of the arrangement of a readback apparatus according to the fourth embodiment.

FIG. 8 is a block diagram showing an example of the arrangement of the readback apparatus according to the fourth embodiment. Note that the same reference numerals in FIG. 8 denote the same parts as in FIG. 6, and only differences will be described below. That is, in FIG. 8, a burst detector 31 and burst position detector 32 are added.

The burst detector 31 and burst position detector 32 have the same functions as those in the conventional readback apparatus. That is, the burst detector 31 detects whether or not the waveform of the digital readback signal is saturated at a maximum output value predetermined in the analog-to-digital converter 1. When the burst detector 31 detects burst interference with which the readback signal after analog-to-digital conversion is saturated at the maximum output value, the burst position detector 32 detects a position where errors occur due to the burst interference, and outputs first loss position information indicating the error occurrence position to the error correcting decoder 8.

On the other hand, as in the third embodiment, when the degree of offtracking of the head is equal to or larger than the threshold Wth, the loss position detector 21 generates second loss position information indicating a position (loss position) where recorded information is lost, and outputs that information to the error correcting decoder 8.

The error correcting decoder 8 applies a decoding method for turbo codes, LDPC codes, and the like, and performs error correcting decoding (including hard decision) using the soft decision likelihood value output from the AR model equalizer 11. At this time, since the decoder 8 skips error correcting decoding at the loss position designated by the second loss position information output from the loss position detector 21, and the error occurrence position designated by the first loss position information output from the burst position detector 32, it uses a decoding algorithm for loss correction at that position.

In this manner, when recorded information is lost as a result of occurrence of extremely large interference from the adjacent track, and when recorded information is lost due to contact of the head to the disc medium, the decoding algorithm for loss correction is used for the part where the recorded information is lost in place of error correcting decoding, thus suppressing deterioration of the error rate characteristics.

Note that FIG. 8 shows the arrangement in which the burst detector 31 and burst position detector 32 are added to the readback apparatus shown in FIG. 6. However, the invention is not limited to such specific case. For example, the same effects can be obtained in case of the arrangement in which the burst detector 31 and burst position detector 32 are added to the readback apparatus shown in FIG. 2, as shown in FIG. 9.

Figure 9:
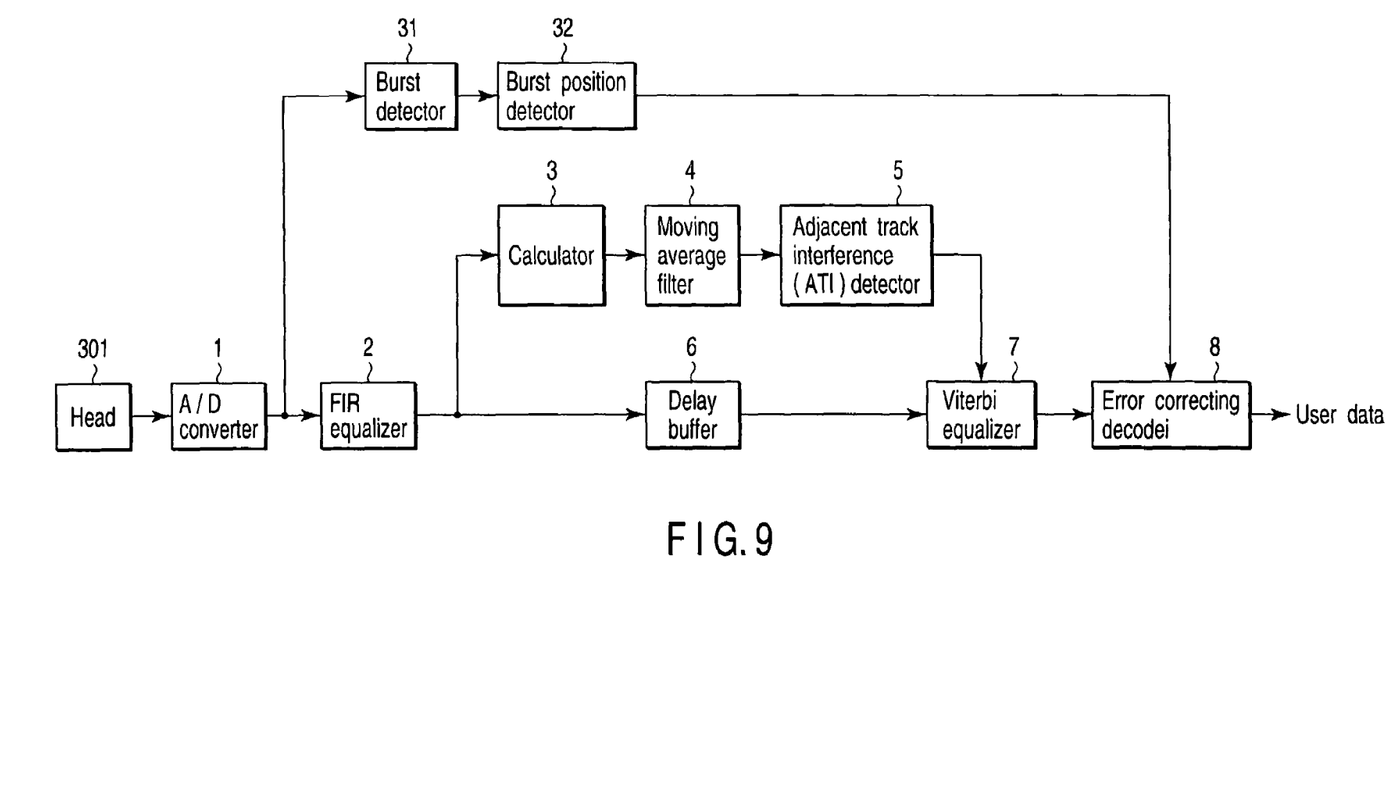
FIG. 9 is a block diagram showing still another example of the arrangement of the readback apparatus according to the third embodiment.

More specifically, in the readback apparatus in FIG. 9, when the burst detector 31 detects burst interference with which the readback signal after analog-to-digital conversion is saturated at the maximum output value, the burst position detector 32 detects a position where errors occur due to the burst interference, and outputs loss position information indicating the error occurrence position to the error correcting decoder 8.

The Viterbi equalizer 7 executes Viterbi equalization using the max-log-MAP algorithm or the like that uses the metric values in consideration of the noise variance due to interference from the adjacent track, and outputs a soft decision likelihood value Λ to the error correcting decoder 8. The error correcting decoder 8 applies a decoding method for turbo codes, LDPC codes, and the like, and performs error correcting decoding (including hard decision) using the obtained soft decision likelihood value. At this time, the decoder 8 skips error correcting decoding at the error occurrence position designated by the loss position information output from the burst position detector 32, and uses a decoding algorithm for loss correction at that position.

Figure 10:
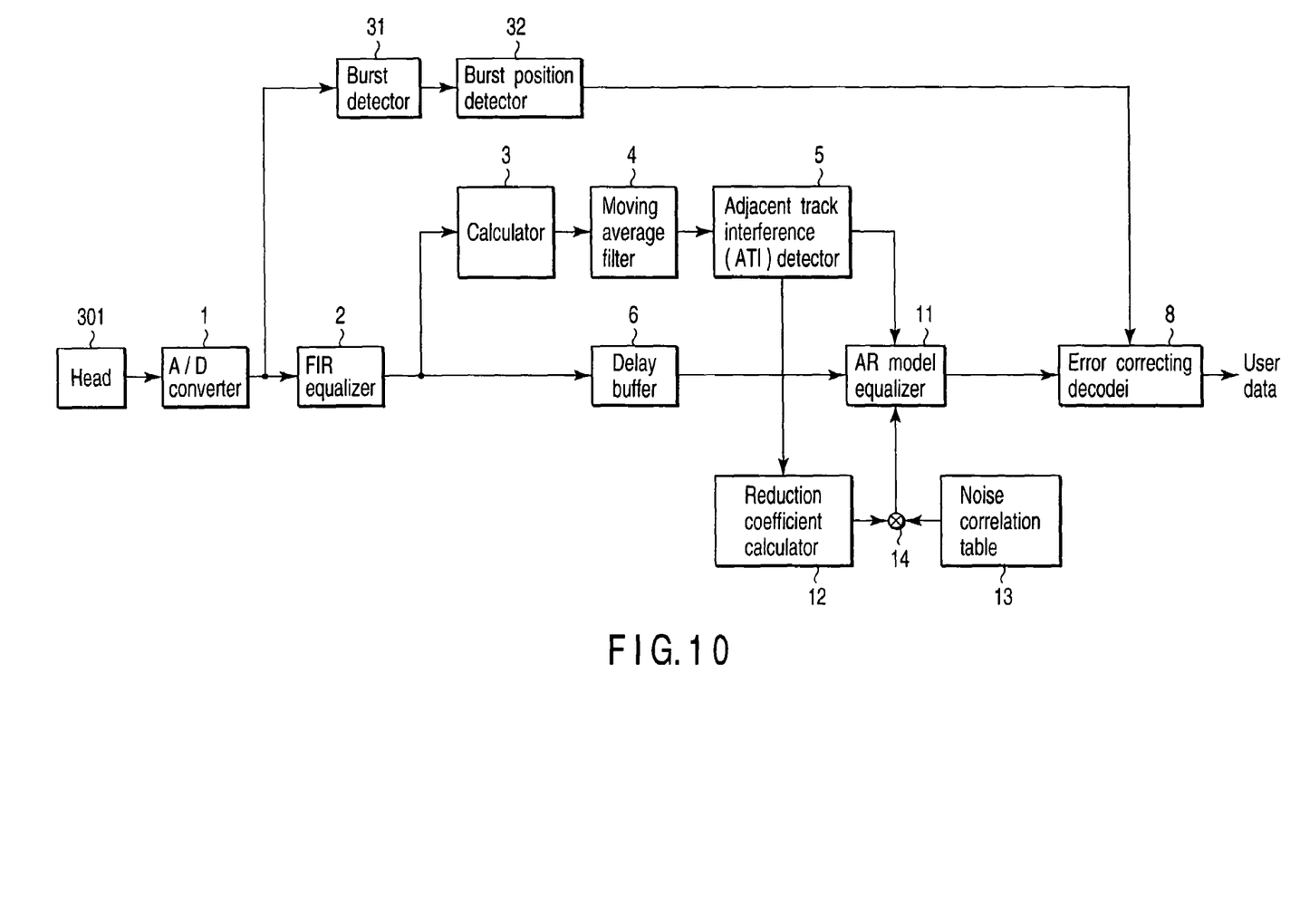
FIG. 10 is a block diagram showing yet another example of the arrangement of the readback apparatus according to the third embodiment.

Also, the same effects can be obtained in case of the arrangement in which the burst detector 31 and burst position detector 32 are added to the readback apparatus shown in FIG. 3, as shown in FIG. 10.

More specifically, in the readback apparatus in FIG. 10, when the burst detector 31 detects burst interference with which the readback signal after analog-to-digital conversion is saturated at the maximum output value, the burst position detector 32 detects a position where errors occur due to the burst interference, and outputs loss position information indicating the error occurrence position to the error correcting decoder 8.

The error correcting decoder 8 applies a decoding method for turbo codes, LDPC codes, and the like, and performs error correcting decoding (including hard decision) using the soft decision likelihood output from the AR model equalizer 11. At this time, since the decoder 8 skips error correcting decoding at the error occurrence position designated by the loss position information output from the burst position detector 32, it uses a decoding algorithm for loss correction at that position.

As described above, according to the fourth embodiment, the soft decision likelihood value Λ that considers interference from the adjacent track is calculated, and error correction is executed using that soft decision likelihood value. In addition, a loss of recorded information that occurs in the readback signal due to interference from the adjacent track or the contact of the head to the disc medium is detected, and the decoding algorithm for loss correction is used at the loss position of recorded information in place of error correction, thereby greatly improving the error rate of readback data of recorded information on the disc medium.

The first to fourth embodiments can improve the error rate upon occurrence of interference from an adjacent track.

In the first to fourth embodiments, the magnetic recording medium has been exemplified as the disc medium. However, the first to fourth embodiments can be similarly applied when the disc medium comprises an optical recording medium or a magneto-optical recording medium.

What is claimed is:

1. A readback apparatus comprising:
   a variance calculator to calculate a variance value of a signal read by a head from a disc medium;
   an estimation unit configured to estimate a degree of offtracking of the head from a target track to an adjacent track, and interference power from the adjacent track using the variance value of the signal;
   a likelihood calculator to calculate a soft decision likelihood value for the signal using the degree of offtracking and the interference power; and
   a decoder to perform error correcting decoding using the soft decision likelihood value.

2. The apparatus according to claim 1, wherein the variance calculation unit calculates the variance value of the signal by calculating a moving average of squares of the signal.

3. The apparatus according to claim 1, wherein the likelihood calculator includes
   (a) a first calculator to calculate a reduction coefficient for a given noise correlation value indicating continuous noise correlation in the signal using the degree of offtracking and the interference power,
   (b) a second calculator to multiply the noise correlation value by the reduction coefficient, to obtain a modified noise correlation values, and (c) a third calculator to calculate the soft decision likelihood value using the modified noise correlation value, the degree of offtracking, and the interference power.

4. The apparatus according to claim 3, wherein the first calculator calculate the reduction coefficient from a ratio of total noise power in the signal including the interference power from the adjacent track to noise power of noise components having correlation of the total noise power except for the interference power from the adjacent track.

5. The apparatus according to claim 1, further comprises a first detector to detect a first loss position where information in the signal is lost based on the degree of offtracking, and wherein the decoder performs loss correcting decoding in place of the error correcting decoding at the first loss position.

6. The apparatus according to claim 1, further comprises a second detector to detect a second loss position where information in the signal is lost and which occurs when the head has contacted the disc medium, and wherein the decoder performs loss correcting decoding in place of the error correcting decoding at the second loss position.

7. The apparatus according to claim 1, further comprises an equalizer to equalize a signal read by the head from the disc medium to a desired partial response (PR) characteristic, and wherein the variance calculator calculates the variance value of the signal equalized.

8. A readback method including:

calculating a variance value of a signal read by a head from a disc medium;

estimating a degree of offtracking of the head from a target track to an adjacent track, and interference power from the adjacent track using the variance value of the signal;

calculating a soft decision likelihood value for the signal using the degree of offtracking and the interference power; and performing error correcting decoding using the soft decision likelihood value.

9. The method according to claim 8, wherein calculating the variance value calculates the variance value of the signal by calculating a moving average of squares of the signal.

10. The method according to claim 8, wherein calculating the soft decision likelihood value includes (a) calculating a reduction coefficient for a given noise correlation value indicating continuous noise correlation in the signal using the degree of offtracking and the interference power, (b) multiplying the noise correlation value by the reduction coefficient, to obtain a modified noise correlation values, and (c) calculating the soft decision likelihood value using the modified noise correlation value, the degree of offtracking, and the interference power.

11. The method according to claim 10, wherein calculating the reduction coefficient calculates the reduction coefficient from a ratio of total noise power in the signal including the interference power from the adjacent track to noise power of noise components having correlation of the total noise power except for the interference power from the adjacent track.

12. The method according to claim 8, further includes detecting a first loss position where information in the signal is lost based on the degree of offtracking, and wherein performing performs loss correcting decoding in place of the error correcting decoding at the first loss position.

13. The method according to claim 8, further includes detecting a second loss position where information in the signal is lost and which occurs when the head has contacted the disc medium, and wherein performing performs loss correcting decoding in place of the error correcting decoding at the second loss position.

14. The method according to claim 8, further includes equalizing a signal read by the head from the disc medium to a desired partial response (PR) characteristic, and wherein calculating the variance value calculates the variance value of the signal equalized.

* * * * *

UNITED STATES PATENT AND TRADEMARK OFFICE
CERTIFICATE OF CORRECTION

PATENT NO. : 7,729,071 B2 Page 1 of 1
APPLICATION NO. : 11/896211
DATED : June 1, 2010
INVENTOR(S) : Harada It is certified that error appears in the above-identified patent and that said Letters Patent is hereby corrected as shown below:

Claim 3, column 16, line 67, change "values," to --value--.

Claim 4, column 17, line 5, change "calculate" to --calculates--.

Claim 10, column 18, line 11, change "values," to --value,--.

Signed and Sealed this

Seventeenth Day of August, 2010

David J. Kappos
*Director of the United States Patent and Trademark Office*